United States Patent [19]

Deprez et al.

[11] Patent Number: 5,712,077
[45] Date of Patent: Jan. 27, 1998

[54] METHOD FOR MAKING BY PHOTOTYPESETTING A LITHOGRAPHIC PRINTING PLATE ACCORDING TO THE SILVER SALT DIFFUSION TRANSFER PROCESS

[75] Inventors: Lode Deprez, Wachtebeke; Paul Callant, Edegem, both of Belgium

[73] Assignee: AGFA-Gevaert, N.V., Mortsel, Belgium

[21] Appl. No.: 787,695

[22] Filed: Jan. 27, 1997

[30] Foreign Application Priority Data

Feb. 26, 1996 [EP] European Pat. Off. ............. 96200481

[51] Int. Cl.$^6$ .................. G03F 7/07; G03C 8/06; G03C 1/18; G03C 1/035
[52] U.S. Cl. .................. 430/204; 430/230; 430/567; 430/588
[58] Field of Search .................. 430/204, 230, 430/588, 567

[56] References Cited

U.S. PATENT DOCUMENTS

| | | | |
|---|---|---|---|
| 4,501,811 | 2/1985 | Saikawa et al. | 430/204 |
| 5,202,218 | 4/1993 | Yoshida et al. | 430/204 |
| 5,456,999 | 10/1995 | Vaes | 430/204 |
| 5,501,939 | 3/1996 | Van Rompoy et al. | 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the following steps:

image-wise exposing with a high intensity-short time exposure with light with a wavelength between 600 nm and 700 nm an imaging element comprising on a support (1) a photosensitive layer comprising at least one photosensitive silver halide emulsion sensitized to light by means of one or more cationic carbocyanine sensitizing dye having a maximum absorption between 600 nm and 700 nm, the silver halide crystals of said silver halide emulsion comprising more than 95 mole % of silver chloride per mole of silver halide and (2) an image receiving layer comprising physical development nuclei in a water permeable relationship with said photosensitive layer, developing said imaging element using an alkaline processing liquid in the presence of (a) developing agent(s) and (a) silver halide solvent(s), characterized in that said silver halide crystals contain silver iodide between 0.25 mole % and 2 mole %/mole silver halide in the outer 10% by weight region of said crystals.

10 Claims, No Drawings

METHOD FOR MAKING BY PHOTOTYPESETTING A LITHOGRAPHIC PRINTING PLATE ACCORDING TO THE SILVER SALT DIFFUSION TRANSFER PROCESS

DESCRIPTION

1. Field of the Invention

The present invention relates to a method for obtaining a lithographic printing plate with a silver halide photographic material sensitive to high intensity-short time exposure with light with a wavelength between 600 nm and 700 nm according to the silver salt diffusion transfer process.

2. Background of the Invention

With recent rapid progress of information transmitting systems, silver halide photographic light sensitive materials have been increasingly required to have high sensitivity. Such systems are, for example, high speed phototypesetting systems according to which information output from an electronic computer is immediately displayed as letters or figures by a cathode ray tube and press facsimile systems for rapid transmission of newspaper originals to a remote place.

Photographic phototypesetting materials include photographic films and papers used in a process for preparing a lithographic printing plate and silver salt diffusion transfer based lithographic printing plates disclosed in e.g. U.S. Pat. No. 4,501,811 and U.S. Pat. No. 4,784,933. With the latter materials a lithographic printing plate is immediately obtained without the need of a contact exposure or camera exposure.

Todate on the market phototypesetters usually work with a He/Ne laser (632 nm), laser diode (680 nm) or LED (670 nm or 780 nm). Especially phototypesetters that operate with a He/Ne laser or LED (670-680 nm) are frequently employed.

For a photographic material to be suitable for use in phototypesetting applications it is required that the material is of high speed to so-called high intensity-short time exposure (flash exposure or scanning exposure), namely exposure for $10^{-4}$ second or less and yields images of high contrast and high resolving power: therefore the emulsion grains contain rhodium and usually iridium dopants.

However, materials sensitized for light with a wavelength between 600 nm and 700 nm are generally not so high in sensitivity and various proposals have been made in an attempt to solve this problem.

To obtain a photographic material of high speed at the wavelengths at which phototypesetters operate the total amount of dye(s) should be kept as low as possible.

When the photographic material is to be used in a silver salt diffusion transfer process and especially for preparing printing plates according to this process it is further required that there is no interference of the spectral sensitization with the diffusion transfer process that may cause a weak and/or low contrast silver image to be formed as occurs in many instances with sensitizing dyes having a maximum absorption for light with a wavelength between 600 nm and 700 nm. When the silver image is intended to be used as a printing plate a weak and/or low contrast silver image may cause bad printing properties such as low printing endurance, low ink acceptance in the printing areas, unwanted ink acceptance in the non printing areas both during start-up of the printing process (toning) and during printing (staining).

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

A type of commercial lithographic printing plate precursors of the latter type typically contain on one side of a flexible support in the order given a base layer serving as an anti-halation layer, a silver halide emulsion layer and a surface layer containing physical development nuclei in which the silver image is formed and on the other side a backing layer pack comprising an antistatic layer comprising a high molecular weight polymeric compound having ionic groups e.g. carboxylic sodium salt groups and as outer layer a protective gelatine layer comprising a matting agent.

Such lithographic printing plate precursors, also called imaging elements may be exposed by means of a scan exposure e.g. a laser or LED exposure. This offers the advantage that the preparation of the printing plate is simplified in that a paste-up to be used for the exposure of the imaging element can be completely prepared on a computer. This paste-up prepared on the computer is then transferred to an image setter equiped with e.g. a laser that takes care of the exposure of the imaging element.

From the above it may be said that it is difficult to sensitize a photographic material suitable for use in the DTR-process for high intensity-short time exposure with light with a wavelength between 600 nm and 700 nm so that it obtains the necessary speed for phototypesetting applications and at the same time fulfilling the other requirements imposed on such photographic materials. So, further improvements in the spectral sensitization of these materials is still desirable.

3. Summary of the Invention

It is an object of the present invention to provide a method for obtaining a lithographic printing plate with good printing properties and improved for sensitivity from a silver halide photographic material sensitive to high intensity-short time exposure with light with a wavelength between 600 nm and 700 nm according to the silver salt diffusion transfer process.

Further objects of the present invention will become clear from the description hereinafter.

According to the present invention there is provided a method for making a lithographic printing plate according to the silver salt diffusion transfer process comprising the following steps: —image-wise exposing with a high intensity-short time exposure with light with a wavelength between 600 nm and 700 nm an imaging element comprising on a support (1) a photosensitive layer comprising at least one photosensitive silver halide emulsion sensitized to light by means of one or more cationic carbocyanine sensitizing dyes having a maximum absorption between 600 nm and 700 nm, the silver halide crystals of said silver halide emulsion comprising more than 95 mole % of silver chloride per mole of silver halide and (2) an image receiving layer comprising physical development nuclei in a water permeable relationship with said photosensitive layer, —developing said imaging element using an alkaline processing liquid in the presence of (a) developing agent(s) and (a) silver halide solvent(s), characterized in that said silver halide crystals contain silver iodide between 0.25 mole % and 2 mole %/mole silver halide in the outer 10% by weight region of said crystals.

4. Detailed Description of the Invention

After extensive research it has been found that a photographic material as described above had an improved sensibility for high intensity-short time exposure and yielded on development printing plates with good printing properties.

The silver halide crystals of said emulsion contain silver iodide preferably from 0.5 mole % to 1.5 mole %/mole AgX, more preferably from 0.65 mole % to 1.3 mole %/mole AgX in the outer 10% by weight region, preferably in the outer 5% by weight region, most preferably in the outer 2% by weight region of said crystals.

In one embodiment the silver iodide is built-in into the silver halide by substitution, i.e. by adding one or more water soluble iodide salts to the emulsion of said silver halide crystals after the addition of the total amount of the water soluble silver salt. In a preferred embodiment a water soluble iodide salt is added together with a water soluble silver salt after the addition of at least 90% of the water soluble silver salt, more preferably after the addition of at least 95% of the water soluble silver salt, most preferably after the addition of at least 98% of the water soluble silver salt. In a particularly preferred embodiment said silver iodide is formed in the final stage of the silver crystal precipitation by adding a solution of a water soluble iodide salt and an equimolar amount of a water soluble silver salt.

Preferred development nuclei for use in accordance with the present invention are sulfides of heavy metals e.g. sulfides of antimony, bismuth, cadmium, cobalt, lead, nickel, palladium, platinum, silver, and zinc. Especially preferred development nuclei in connection with the present invention are palladium sulfide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Preferably said physical development nuclei have an average diameter less than 6 nm and the number of nuclei having a diameter larger than 4.5 nm is less than 15% of the total number of nuclei. Although the size of the nuclei above is expressed by a diameter this does not imply that the nuclei are necessarily spherical. By diameter is meant the diameter of a sphere having an equivalent volume so that the size of nuclei of a variety of shapes can be characterized by the same parameter.

The amount of nuclei used in the image receiving layer is preferably between 0.2 mg/m$^2$ and 20 mg/m$^2$, more preferably between 0.4 mg/m$^2$ and 18 mg/m$^2$, most preferably between 0.6 mg/m$^2$ and 15 mg/m$^2$.

According to one preferred embodiment of the present invention a lithographic printing plate can be obtained by means of the DTR-process using an imaging element comprising on a support in the order given a silver halide emulsion layer and a layer containing physical development nuclei in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

Supports suitable for use in accordance with the present invention may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

The photosensitive layer used according to the present invention may be any layer comprising a hydrophilic colloid binder and at least one silver halide emulsion in accordance with the invention, at least the silver halide emulsions in accordance with the invention being photosensitive.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

To take most advantage of the present invention the emulsion or emulsions preferably consist principally of silver chloride while a fraction of silver bromide may be present upto 4.8 mole %/mole AgX.

The average size of the silver halide grains may range from 0.10 to 0.70 µm, preferably from 0.20 to 0.45 µm.

600 nm and 700 nm corresponds to the following formula I

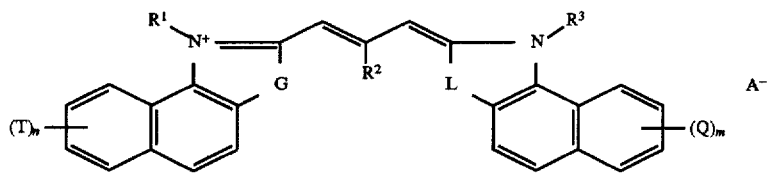

Formula I

The size distribution of the silver halide particles of the photographic emulsions to be used according to the present invention can be homodisperse or heterodisperse. A homodisperse size distribution is obtained when 90% by weight of the grains have a size that does not deviate more than 30% from the average grain size.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$. This results in the building-in in the silver halide crystal lattice of minor amounts of iridium and/or rhodium, so-called iridium and/or rhodium dopants. As known to those skilled in the art numerous scientific and patent publications disclose the addition of iridium or rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P-493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The silver halide emulsion of the DTR-element is spectrally sensitized with one or more cationic carbocyanine sensitizing dyes with a maximum absorption for light with a wavelength between 600 nm and 700 nm.

By the maximum absorption of a sensitizing dye is meant the absorption of said dye determined in a silver halide emulsion according to the invention.

The increase in sensitivity of the photographic material is only obtained when a cationic carbocyanine sensitizing dye with a maximum absorption for light with a wavelength between 600 nm and 700 nm is used. Thus the effect is not obtained or is much smaller when a sensitizing dye of the anionic type is used. Such is surprisingly and it is not understood why the effect is only obtained with dyes of the cationic type. It may be that this is due to the generally lower solubility of the cationic dyes in aqueous medium.

Sensitizing dyes with a maximum absorption for light with a wavelength between 600 nm and 700 nm suitable for use in accordance with the present invention are the cationic carbocyanine sensitizing dyes with a maximum absorption for light with a wavelength between 600 nm and 700 nm commonly employed e.g. the cationic dyes described by F. M. Hamer in "The Cyanine Dyes and Related Compounds", 1964, John Wiley & Sons. Preferred sensitizing dyes with a maximum absorption for light with a wavelength between wherein each of $R^1$ and $R^3$ independently represents $C_1$–$C_4$ alkyl, $R^2$ represents hydrogen or an alkyl, aralkyl, or aryl group each of which groups may be substituted, each of G and L independently represents S or Se, each of n and m represents an integer from 1 to 4, T and Q each independently represents hydrogen, a substituent selected from the group consisting of alkyl, aryl, aralkyl, halogen, —CN, ester, hydroxyl, —$NH_2$, —NHR', —$NR'_2$ and alkoxy or when n is 2 or more T may represent the necessary atoms to complete one or more fused-on rings and when m is 2 or more Q may represent the necessary atoms to complete one or more fused-on rings, R' represents an alkyl, cycloalkyl or aryl group each of which group may be substituted, and $A^-$ represents an anion. More preferably are sensitizing dyes corresponding to formula I wherein each of $R^1$ and $R^3$ independently represents $C_1$–$C_4$ alkyl, $R^2$ represents hydrogen or an alkyl group which may be substituted, G and L each represents S, each of n and m represents an integer from 1 to 4, T and Q each independently represents hydrogen or an alkyl, and $A^-$ represents an anion. Most preferably are sensitizing dyes corresponding to formula I wherein each of $R^1$ and $R^3$ independently represents $C_1$–$C_2$ alkyl, $R^2$ represents an unsubstituted alkyl group, G and L each represents S, each of n and m represents the integer 4, T and Q each represents hydrogen and $A^-$ represents an anion. Particularly preferably is a sensitizing dye corresponding to formula I wherein each of $R^1$ and $R^3$ represents a methyl group, $R^2$ represents an ethyl group, G and L each represents S, each of n and m represents the integer 4, T and Q each represents hydrogen and $A^-$ represents an anion.

To enhance the sensitivity use can be made of so-called supersensitizers in combination with the sensitizing dyes in accordance with the invention. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual stabilizers e.g. azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P-2,453,217.

More details about the composition, preparation and coating of silver halide emulsions can be found in e.g. Product Licensing Index, Vol. 92, December 1971, publication 9232, p. 107–109.

In addition to the above described emulsion layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivity, light reflecting pigments, titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. Gelatin can, however, be replaced in part or integrally by synthetic, semi-synthetic, or-natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% by weight of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as pluronics, saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth) acrylates, sulphoalkyl (meth)acrylates, and styrene sulphonic acids.

The above described photographic material element is information-wise exposed using a scanning exposure beam between 600 nm and 700 nm and is subsequently developed in an alkaline aqueous processing liquid in the presence of (a) developing agent(s) and a silver halide solvent.

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secundary or primary type. Examples of alkanolamines that may be used in connection with the present invention correspond to the following formula:

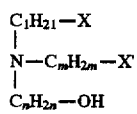

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

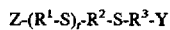

wherein Z and Y each independently represents hydrogen, an alkyl group, an amino group, an ammonium group, a hydroxyl, a sulfo group, a carboxyl, an aminocarbonyl or an aminosulfonyl. $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

According to a preferred embodiment of the present invention at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m², more preferably between 0.1 and 5 mmol/m² and most preferably between 0.5 and 1.5 mmol/m². More details are disclosed in EP-A-0,554,585

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as hydroxy, amino, carboxylic acid group, sulphonic acid group etc.. Examples of 1-phenyl-3-pyrazolidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

At least the auxiliary developing agents are preferably incorporated into the photographic material, preferably in the silver halide emulsion layer of the photographic material, in an amount of less than 150 mg/g of silver halide expressed as $AgNO_3$, more preferably in an amount of less than 100 mg/g of silver halide expressed as $AgNO_3$.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

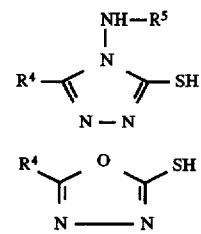

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc.. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. No. 3,038,805—4,038,075—4,292,400—4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic / hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

According to another preferred embodiment of the present invention a lithographic printing plate can be obtained by means of the DTR-process using an imaging element comprising in the order given a hydrophilic surface of a support, an image receiving layer containing physical development nuclei and a silver halide emulsion layer in water permeable relationship with said image receiving layer.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports e.g. a paper support or a resin support are described above.

Said hydrophilic surface of a support is preferably a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µm and is sealed with an aqueous bicarbonate solution.

According to the present invention the roughening of the aluminum foil can be performed according to the methods well known in the prior art. The surface of the aluminum substrate can be toughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like $H_2SO_4$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ Al$_2$O$_3$.H$_2$O. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

The imaging element of the present embodiment is imaged using a scanning exposure as described above followed by a development step in the presence of development agent(s) and silver halide solvent(s) according to the invention so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilate the removal of the silver halide emulsion layer it is advantageous to provide a layer between the hydrophilic surface of a support and the silver halide emulsion layer comprising a hydrophilic non-proteinic film-forming polymer e.g. polyvinyl alcohol, polymer beads e.g. poly(meth) acrylate beads, mixtures thereof, particles of a water insoluble inorganic compound having a number average size not lower than 0.1 μm, alkali insoluble non-polymeric organic compounds having a melting point of at least 50° C. and a number average size between 0.1 μm and 10 μm or particles of an alkali insoluble polymeric organic compound obtainable by polycondensation and having a number average size between 0.02 μm and 10 μm. Such type of layers are disclosed in EP-A-483415, EP-A-410500, EP-A-94203779.7, EP-A-95201713.5 and EP-A-95203052.6.

Finally said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkey red oil may be added.

A lithographic plate is thus obtained.

The following examples illustrate the present invention without limiting it thereto. All percentages are by weight unless stated otherwise.

EXAMPLE 1

Preparation of the silver halide emulsion coating solution

A silver chlorobromide emulsion composed of 98.2 mol % of chloride and 1.8 mol % of bromide was preparedby the double jet precipitation method. The average silver halide grain size was 0.38 μm (diameter of a sphere with equivalent volume) and contained rhodium ions as internal dopant. The silver iodide-content is established immediately after the physical ripening and before the chemical ripening by means of a co-precipitation of silver nitrate and a water soluble iodide. This gives a more homogeneously distributed silver iodide-content, compared to the traditional means whereby the iodide is implanted during a conversion process. Emulsion 1 contained 0.2 mol % silver iodide/mole silver halide, emulsion 2 contained 0.5 mol % silver iodide/mole silver halide and emulsion 3 contained 0.8 mol % silver iodide/ mole silver halide. The chemical ripening is performed directly after the silver iodide precipitation is finished. After the chemical ripening 4-hydroxy-6-methyl-1,3,3a,7-tetraazaindene was added as stabilizer in an amount of 290 mg/mole of silver halide.

Prior to coating the emulsions 1 to 3 were red sensitised using a red sensitizing dye as indicated in table 1 in an amount of 4.9*10$^{-4}$ mole/mole AgX. Finally 2-mercapto-5-n.heptyl-1,3,4-oxadiazole (33.8 mg/mole of silver halide) and 7-sulpho-nafto-(2,3-d)-oxazolidine-2-thione (540 mg/mole of silver halide) were added to the emulsions. In this way the silver halide emulsion containing coating solutions I to X were prepared.

A base layer coating solution was prepared having the following composition:

| | |
|---|---|
| gelatin | 5.5% |
| carbon black | 0.76% |

Preparation of the imaging elements.
Preparation of the imaging elements I to X

Ten polyethylene terephthalate film support having a thickness of 175 μm and being provided with an adhesion improving layer were each coated with a layer containing gelatin in an amount of 0.4 g/m² and colloidal silica having an average particle diameter of 7 nm in an amount of 0.4 g/m². The adhesion improving layer contained a copolymer of itaconic acid (2%), vinylidene chloride (88%) and methylmethacrylate (10%).

The emulsion coating solutions I to X were respectively coated simultaneously with the base layer coating solution by means of the cascade coating technique to the above mentioned subbed polyethylene terephthalate supports provided with a pack of two backing layers such that the base layer coating was coated directly to the side of the support opposite to the side containing said backing layers. The emulsion layers were coated such that the silver halide coverage expressed as $AgNO_3$ was 1.25 g/m² and the gelatin content was 1.34 g/m². The emulsion layers further contained 0.350 g/m² of 1-phenyl-4,4'-dimethyl-3-pyrazolidone, 0.25 g/m² of hydroquinone and 120 mg/m² of formaldehyde as a hardener. The base layer was coated such that the amount of gelatin in the coated layer was 2.7 g/m². The base layer further contains titaniumdioxide particles and carbon black as anti-halation means, together with a non-water swellable latex but was free of matting agents. The emulsion layer contains silica particles to improve the water-transport on press.

The first subbing layer on the backside comprised 3.1 mg/m² of an antistatic composition consisting of 2.2 mg/m² of polystyrene sulphonic acid and 0.9 mg/m² of poly(3,4-ethylenedioxy-thiophene).

The layer nearest to the support of the backing layer pack contained 0.08 g/m² of gelatin. The second backing layer contained 2.8 g/m² of gelatin, 0.065 g/m² of a matting agent consisting of transparent spherical polymeric beads of 3 micron average diameter according to EP-A-080,225, 1.5 g/m² of dispersed barium sulfate (average diameter 0.3–0.4 mμ), 3.0 g/m² of colloidal silica, 0.05 g/m² of hardening agent triacrylformal and 0.021 g/m² of wetting agent $F_{15}C_7$-$COONH_4$.

The thus obtained elements were dried and subjected to a temperature of 40° C. for 5 days and then the emulsion layers were overcoated with a layer containing PdS as physical development nuclei, hydroquinone at 0.4 g/m² and formaldehyde at 33 mg/m².

The following processing solutions were prepared

| | A |
|---|---|
| Developer | |
| sodium hydroxide (g) | 30 |
| methylhydroquinone (g) | 2 |
| sodium sulphite anh. (g) | 35 |
| 1-methyl,4-butenyl,5-methyl 1,2,4-triazolium-3-thiolate (mg) | 800 |
| 2-Aminoethyl-aminoethanol (ml) | 45 |
| 2-mercapto-5-n.heptyl-oxa-3,4-diazole (mg) | 350 |
| ethylenediamine-tetraacetic acid sodium salt (g) | 1 |
| water to make | 1 l |
| Neutralixation solution | |
| citric acid | 10 g |
| sodium citrate | 35 g |
| sodium sulphite anh. | 5 g |
| phenol | 50 mg |
| water to make | 1 l |

The above described imaging elements I to X were image-wise exposed with a He/Ne laser image setter and processed with the above described activator for 20 seconds at 30° C., subsequently neutralized at 25° C. with the neutralization solution described above and dried.

The results are summed up in the following table 1.

The sensitivity was evaluated as follows:

Sensitivity: the negative logaritme of the exposure at the density=(Dmax+Dmin)/2. A higher number means a more sensitive material. The sensitivity of the imaging elements was evaluated relative to the imaging element II which was used as the reference (sensitivity=100).

TABLE 1

| Imaging element | Emulsion | Sensitiing dye[a] | Sensitivity |
|---|---|---|---|
| I | 1 | Cpd 1 | 105 |
| II | 1 | Cpd 2 | 100 |
| III | 1 | Cpd 3 | 100 |
| IV | 2 | Cpd 1 | 120 |
| V | 2 | Cpd 2 | 100 |
| VI | 2 | Cpd 3 | 90 |
| VII | 3 | Cpd 1 | 153 |
| VIII | 3 | Cpd 2 | 100 |
| IX | 3 | Cpd 3 | 108 |
| X | 3 | Cpd 4 | 40 |

TABLE 1-continued

| Imaging element | Emulsion | Sensitizing dye[a] | Sensitivity |
|---|---|---|---|

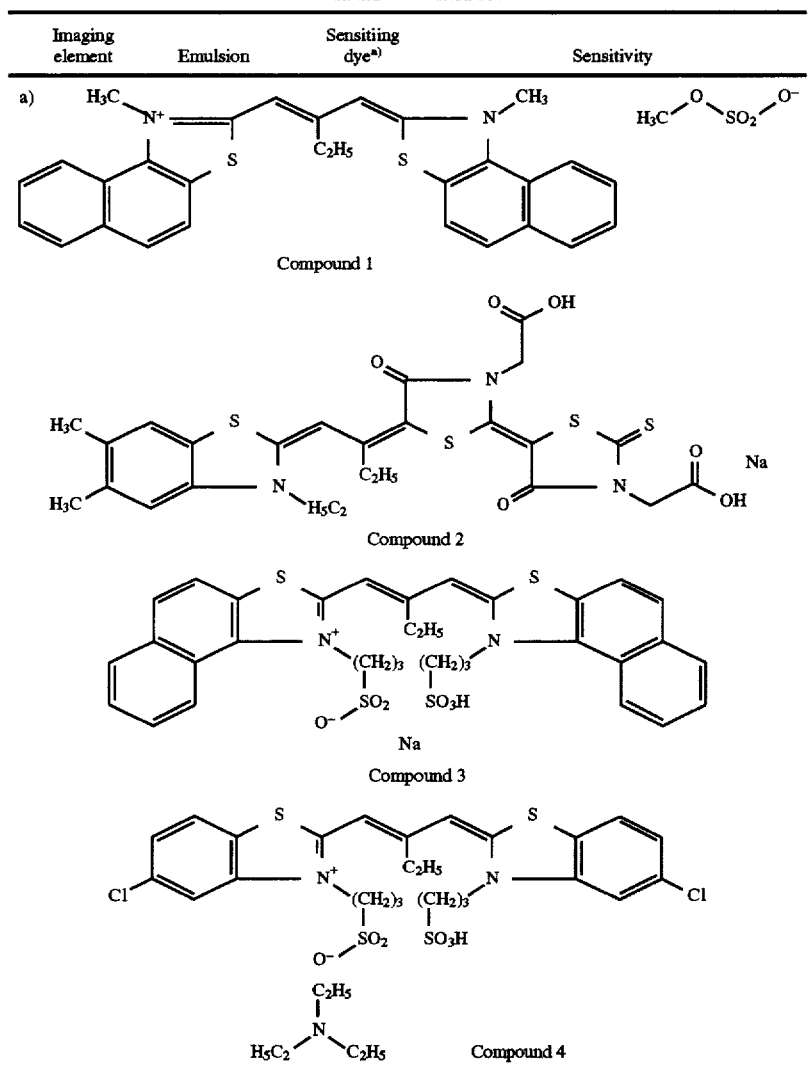

The printing plates thus prepared from the imaging elements I, IV and VII were mounted on an offset printing machine (AB DICK 350 CD—trade name for offset printing machine manufactured by AB DICK Co.). During the printing run a commercial dampening solution was used in each case. All these printing plates performed well in printing.

It is clear from the results in table 1 that imaging elements IV and VII being spectrally sensitized with Cpd 1 (a sensitizing dye in accordance with the invention) and containing on the surface of the crystals of the silver halide emulsion 0.5 or 0.8 mole % silver iodide/mole silver halide showed a clearly increased sensitivity compared with the imaging element I being also spectrally sensitized with Cpd 1 but only containing on the surface of the crystals of the silver halide emulsion 0.2 mole % silver iodide/mole silver halide and compared with the imaging elements II, III, V, VI, VIII, IX and X being spectrally sensitized with Cpd 2, Cpd 3 or Cpd 4 being sensitizing dyes of the anionic type.

We claim:

1. A method for making a lithographic printing plate according to the silver salt diffusion transfer process comprising the following steps:

image-wise exposing with a high intensity-short time exposure with light with a wavelength between 600 nm and 700 nm an imaging element comprising on a support (1) a photosensitive layer comprising at least one photosensitive silver halide emulsion sensitized to light by means of one or more cationic carbocyanine sensitizing dyes having a maximum absorption between 600 nm and 700 nm, the silver halide crystals of said silver halide emulsion comprising more than 95 mole % of silver chloride per mole of silver halide and (2) an image receiving layer comprising physical development nuclei in a water permeable relationship with said photosensitive layer, developing said imaging element using an alkaline processing liquid in the presence of (a) developing agent(s) and (a) silver halide solvent(s), characterized in that said silver halide crystals contain silver iodide between 0.25 mole % and 2 mole %/mole silver halide in the outer 10% by weight region of said crystals.

2. A method according to claim 1 wherein said silver halide crystals of said emulsion contain silver iodide from 0.5 mole % to 1.5 mole %/mole AgX in the outer 10% by weight region of said crystals.

3. A method according to claim 1 wherein said silver halide crystals of said emulsion contain silver iodide from 0.65 mole % to 1.3 mole %/mole AgX in the outer 10% by weight region of said crystals.

4. A method according to claim 1 wherein said silver halide crystals of said emulsion contain said silver iodide in the outer 5% by weight region of said crystals.

5. A method according to claim 1 wherein said silver halide crystals of said emulsion contain said silver iodide in the outer 2% by weight region of said crystals.

6. A method according to claim 1 wherein said silver iodide is built-in into said silver halide crystals of said emulsion by adding a water soluble iodide salt together with a water soluble silver salt after the addition of at-least 90% of the water soluble silver salt.

7. A method according to claim 1 wherein at least one of said one or more cationic carbocyanine sensitizing dyes corresponds to the following formula I

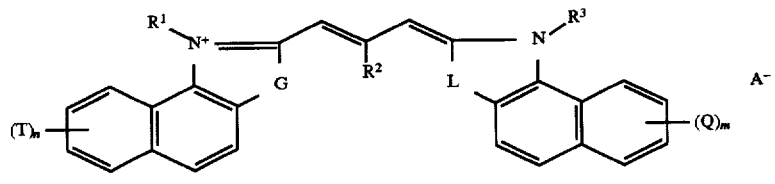

Formula I wherein each of $R^1$ and $R^3$ independently represents $C_1$–$C_4$ alkyl, $R^2$ represents hydrogen or an alkyl, aralkyl, or aryl group each of which groups may be substituted, each of G and L independently represents S or Se, each of n and m represents an integer from 1 to 4, T and Q each independently represents hydrogen, a substituent selected from the group consisting of alkyl, aryl, aralkyl, halogen, —CN, ester, hydroxyl, —NH$_2$, —NHR', —NR'$_2$ and alkoxy or when n is 2 or more T may represent the necessary atoms to complete one or more fused-on rings and when m is 2 or more Q may represent the necessary atoms to complete one or more fused-on rings, R' represents an alkyl, cycloalkyl or aryl group each of which group may be substituted, and A$^-$ represents an anion.

8. A method according to claim 1 wherein at least one of said one or more cationic carbocyanine sensitizing dyes corresponds to the formula I wherein each of $R^1$ and $R^3$ independently represents $C_1$–$C_4$ alkyl, $R^2$ represents hydrogen or an alkyl group which may be substituted, G and L each represents S, each of n and m represents an integer from 1 to 4, T and Q each independently represents hydrogen or an alkyl, and A$^-$ represents an anion.

9. A method according to claim 1 wherein at least one of said one or more cationic carbocyanine sensitizing dyes corresponds to the formula I wherein each of $R^1$ and $R^3$ independently represents $C_1$–$C_2$ alkyl, $R^2$ represents an unsubstituted alkyl group, G and L each represents S, each of n and m represents the integer 4, T and Q each represents hydrogen and A$^-$ represents an anion.

10. A method according to claim 1 wherein at least one of said one or more cationic carbocyanine sensitizing dyes corresponds to the formula I wherein each of $R^1$ and $R^3$ represents a methyl group, $R^2$ represents an ethyl group, G and L each represents S, each of n and m represents the integer 4, T and Q each represents hydrogen and A$^-$ represents an anion.

* * * * *